United States Patent
Pan et al.

(10) Patent No.: US 7,521,811 B2
(45) Date of Patent: Apr. 21, 2009

(54) SUBSTRATE FOR PACKAGING SEMICONDUCTOR CHIP AND METHOD FOR MANUFACTURING THE SAME

(75) Inventors: Yung Teng Pan, Chiaotou Shiang (TW); Chia Hung Chen, LiuChiu Shiang (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 449 days.

(21) Appl. No.: 11/044,836

(22) Filed: Jan. 28, 2005

(65) Prior Publication Data
US 2005/0167804 A1 Aug. 4, 2005

(30) Foreign Application Priority Data
Jan. 30, 2004 (TW) ............................... 93102121 A

(51) Int. Cl.
*H01L 29/40* (2006.01)
*H01L 21/44* (2006.01)

(52) U.S. Cl. ...................................... 257/781; 438/614

(58) Field of Classification Search ................ 257/736, 257/748, 779–784; 438/612–614
See application file for complete search history.

(56) References Cited

U.S. PATENT DOCUMENTS 5,508,228 A * 4/1996 Nolan et al. ................. 438/614
6,396,135 B1 * 5/2002 Narvaez et al. ............. 257/678

* cited by examiner

*Primary Examiner*—Calvin Lee

(57) ABSTRACT

A substrate for packaging a semiconductor chip includes a dielectric layer, a plurality of conductive circuits and bonding pads formed on the dielectric layer, a metal thin deposition layer formed on the conductive circuits and the bonding pads, and a solder mask formed on the dielectric layer and the conductive circuits. The first ends of the bonding pads extend from the conductive circuits. The metal thin deposition layer has at least a portion to protrude out of the conductive circuits and the bonding pads such that the protruding portion of the metal thin position layer is not supported by the conductive circuits or the bonding pads. The bonding pads are exposed form the solder mask except that the second end of each bonding pad is covered by the solder by the solder mask in the manner that the protruding portion of the metal thin deposition layer is embedded in the solder mask.

5 Claims, 3 Drawing Sheets

SUBSTRATE FOR PACKAGING SEMICONDUCTOR CHIP AND METHOD FOR MANUFACTURING THE SAME

RELATED APPLICATIONS

The present application is based on, and claims priority from, Taiwanese Application No. 093102121, filed Jan. 30, 2004, the disclosure of which is hereby incorporated by reference herein in its entirety.

FIELD OF THE INVENTION

The present invention relates to a substrate used for packaging a semiconductor chip and its manufacturing method.

BACKGROUND OF THE INVENTION

The semiconductor chip package technology gradually becomes a constraint factor for developing a more efficient semiconductor chip package. Package designers always struggle against catching up with the pin count increase, dimensional limitation, profile mounting constraint and other requirements developed gradually for packaging and associating integrated circuits. Referring to FIG. 1, it depicts a conventional semiconductor chip package, a Ball Grid Array (BGA) package 100. It comprises at least a semiconductor chip 102 disposed on a substrate 104 and connected electrically to bonding pads 105 of the substrate 104 by a wire bonding method, a plurality of arrayed solder ball pads 106 formed on the substrate 104 to combine with solder balls 108 and a package body 110 enclosing the chip 102 and wires 112 (made by wire bonding). The package 100 is mounted to a printed circuit board (not shown in the figure) by the plurality of solder balls 108. The solder ball 108 is formed on the package 100 or the solder ball bonding pad of the printed circuit board and melted by heating (reflowed) to have the package 100 soldered to the printed circuit board.

For more details, referring to FIG. 2, the surface of the substrate 104 usually has a solder mask 202 covering the substantially whole surface of the substrate 104, and there are only bonding pads 105 exposed from the solder mask. The bonding pads 105 are made of copper and have a metal thin deposition layer 204, including a nickel layer 204a and a gold layer 204b formed on their surfaces. When the substrate 104 is made by the gold pattern plating (GPP) process, the bonding pads 105 are formed through etching a copper layer with a mask of the metal thin deposition layer 204. During the etching process, the over etching phenomenon is generally found, which leads to the metal thin deposition layer 204 protruding over the bonding pads 105 so that part of the metal thin deposition layer 204 is not supported by the bonding pads 105. When the substrate 104 is in the electrical testing or wire bonding process, the bonding pads 105 will be pressed and stretched, and the metal thin deposition layer easily collapses, peels and even breaks.

SUMMARY OF THE INVENTION

The object of the present invention is to provide a substrate used for packaging semiconductor chips and its manufacturing method for overcoming or improving the above-mentioned problems of the prior technology.

For achieving the above-mentioned and other objects, the substrate of the present invention comprises a dielectric layer, a plurality of conductive circuits and a plurality of bonding pads formed on the dielectric layer, a metal thin deposition layer formed on the conductive circuits and bonding pads and a solder mask formed on the dielectric layer and conductive circuits so as to have the bonding pads substantially exposed on the solder mask. The bonding pad has opposing first and second ends. The first ends of the bonding pads extend from the conductive circuits. It should be noted that the metal thin deposition layer has at least a portion protruding over the conductive circuits and the bonding pads so as to have the protruding portion of the metal thin deposition layer not supported by the conductive circuits and the bonding pads. According to the present invention, since the solder mask covers the second ends of the bonding pads, the protruding portion of the metal thin deposition layer is embedded in the solder mask.

The present invention also provides a method for manufacturing the above-mentioned substrate. First, a metal layer is formed on a dielectric layer, and then, a photoresist layer is formed on the metal layer. The photoresist layer is patterned to have part of the metal layer exposed from the patterned photoresist layer. Then, a metal thin deposition layer is formed on the portion of the metal layer exposed from the patterned photoresist layer. The photoresist layer is removed, and the metal layer is patterned with a mask of the metal thin deposition layer to form a plurality of conductive circuits and a plurality of bonding pads on the dielectric layer, wherein the first end of the bonding pad extends from the conductive circuits. Then, a solder mask is formed on the dielectric layer and the conductive circuits, wherein the bonding pads are exposed from the solder mask except that the second end of each bonding pad is covered by the solder mask so that the metal thin deposition layer has a portion protruding over the bonding pad. The protruding portion is embedded in the solder mask.

According to the substrate and its manufacturing method provided by the present invention, the solder mask is used to embed the portion, where the metal thin layer protrudes over the bonding pad, on at least one end of the bonding pad so as to prevent the bonding pad from being pressed and stretched and then prevent the metal thin deposition layer on the bonding pad from collapsing, peeling and breaking.

BRIEF DESCRIPTION OF THE DRAWINGS

Other objects, advantages, and novel features of the invention will become more apparent from the following detailed description in conjunction with the accompanying drawing.

DETAILED DESCRIPTION OF THE PREFERRED EMBODIMENTS

Figure 1:
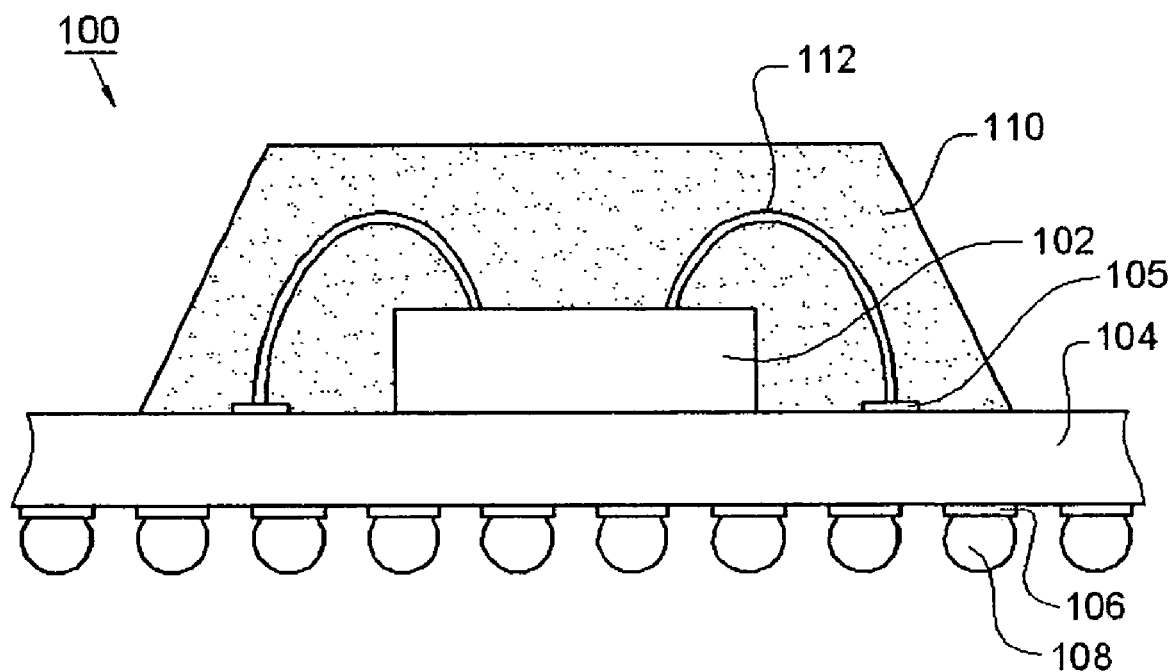
FIG. 1 is the cross section of a conventional ball grid array package.
Figure 2:
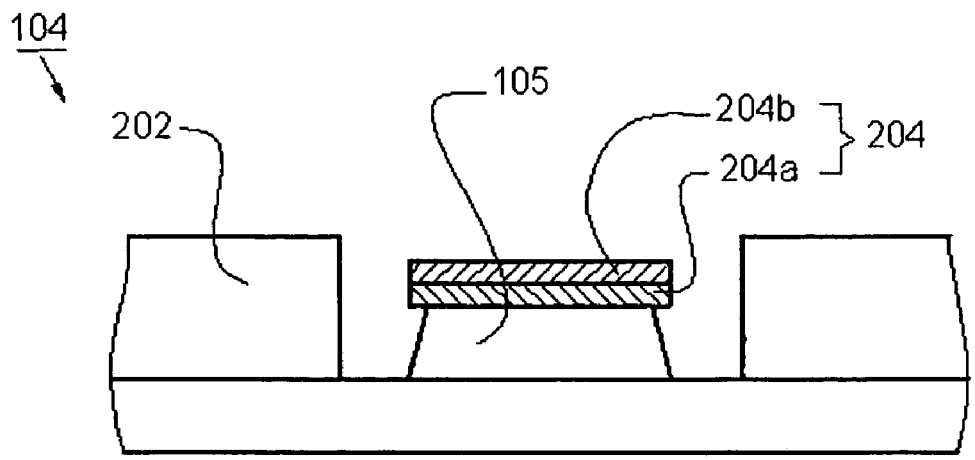
FIG. 2 is the enlarged cross section of the substrate of FIG. 1.
Figure 3:
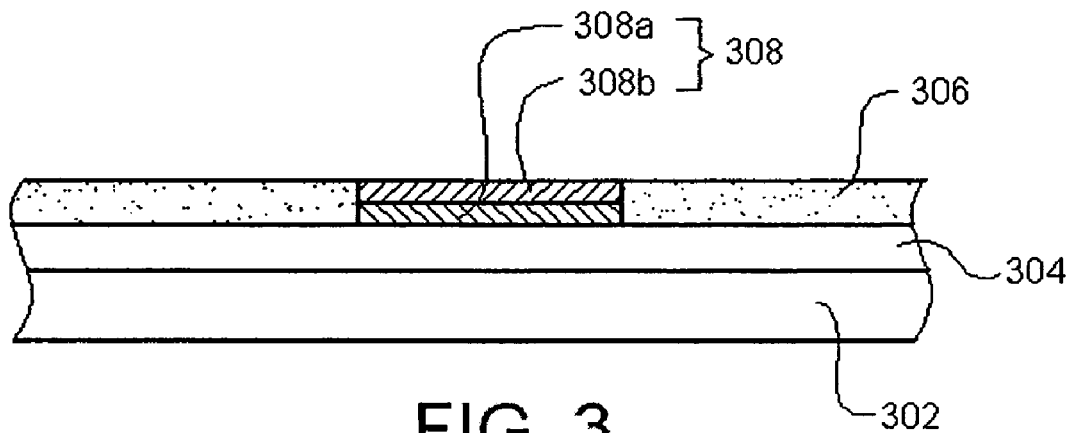
FIG. 3 and FIG. 4 show the manufacturing steps of the substrate of the present invention by the partial cross sections.
Figure 4:
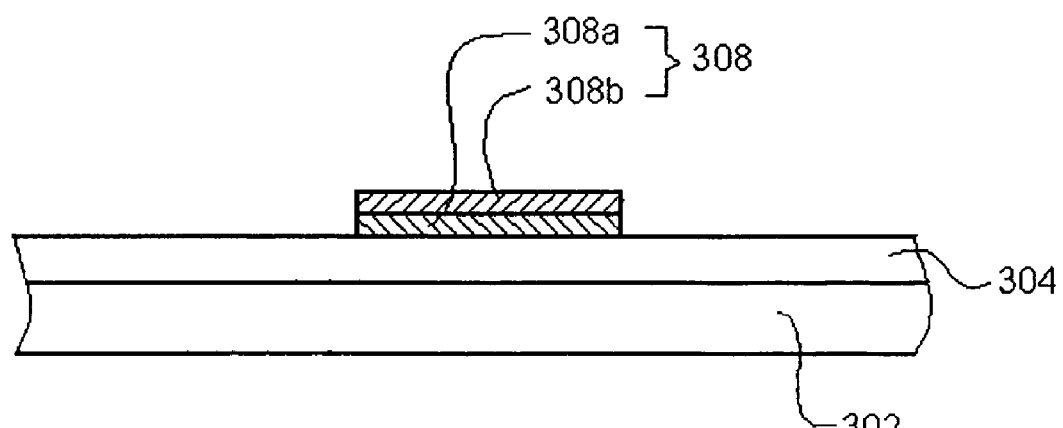
Figure 5:
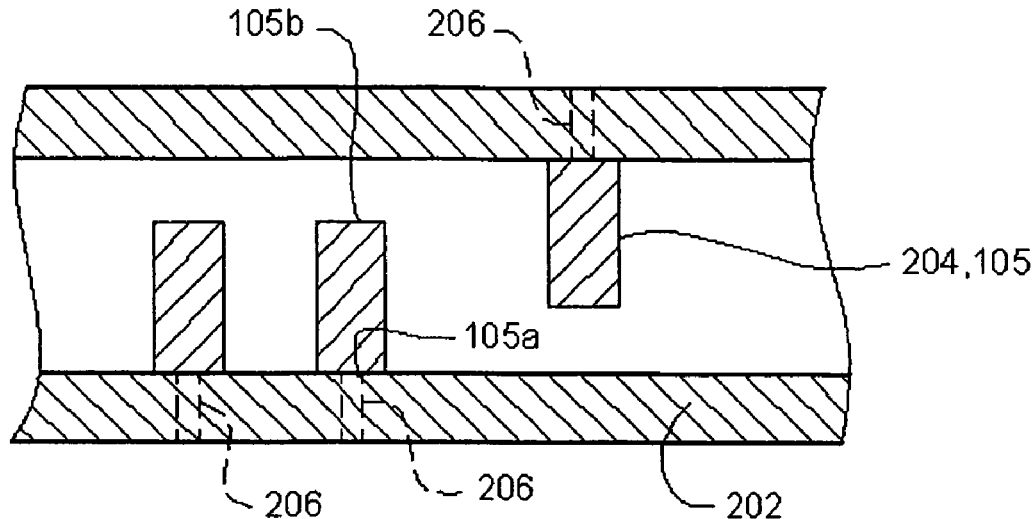
FIG. 5 is the enlarged top view of the substrate of FIG. 1.

Referring to FIGS. 3 and 4, the conductive circuits and the bonding pads of the ball grid array substrate are formed by the following steps. First, a metal layer 304 is formed on the surface of a dielectric layer 302. Generally speaking, during this step, a copper foil is stuck to the dielectric layer 302. Then, a photoresist layer 306 is formed on the metal layer 304, and the photoresist layer 306 is patterned to have a predetermined area of the conductive circuits and the bonding pads on the surface of the metal layer 304 exposed from the patterned photoresist layer 306. Then, a metal thin deposition layer 308 is formed by the electroplating method on the surface of the metal layer 304, which is exposed from the patterned photoresist layer 306. In this embodiment, the metal thin deposition layer 308 comprises a nickel layer 308a formed on the metal layer 304 and a gold layer 308b formed on the nickel layer 308a. Referring to FIG. 4, after removing the photoresist layer 306, the metal layer is patterned with a mask of the metal thin deposition layer 308 to form a plurality of conductive circuits and bonding pads. To protect the conductive circuits of the substrate and to prevent their electrical properties from being influenced by steam or dusts, it is necessary to coat a solder mask on the surface of the substrate to cover the substantially whole surface of the substrate and only have outside-connecting bonding pads exposed. As shown in FIGS. 2 and 5, in the conventional substrate 104, the solder mask 202 keeps a distance from the bonding pads 105 and the metal thin deposition layer 204 on the bonding pads 105. However, during the above-mentioned steps of patterning the metal layer, the over etching phenomenon happens at the metal layer near the metal thin deposition layer. Therefore, as shown in FIG. 2, the metal thin deposition layer 204 usually protrudes over the bonding pads 105 to have part of the metal thin deposition layer 204 not supported by the bonding pads. Referring to FIG. 5, the metal thin deposition layer 204 on the bonding pads 105 has one end 105a connected to the conductive circuits and the other end 105b having no support. When the metal thin deposition layer 204 on the bonding pads 105 are pressed and stretched during wire bonding or testing, the protruding portion of the metal thin deposition layer 204 over the ends 105b of the bonding pads 105 easily collapses, peels and even breaks.

Figure 6:
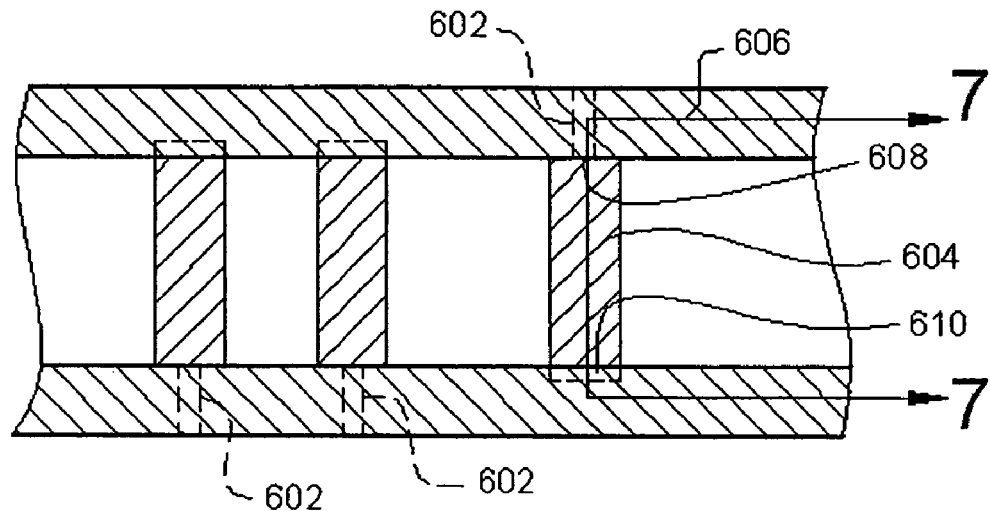
FIG. 6 is the partial top view of the substrate in accordance with one embodiment of the present invention.
Figure 7:
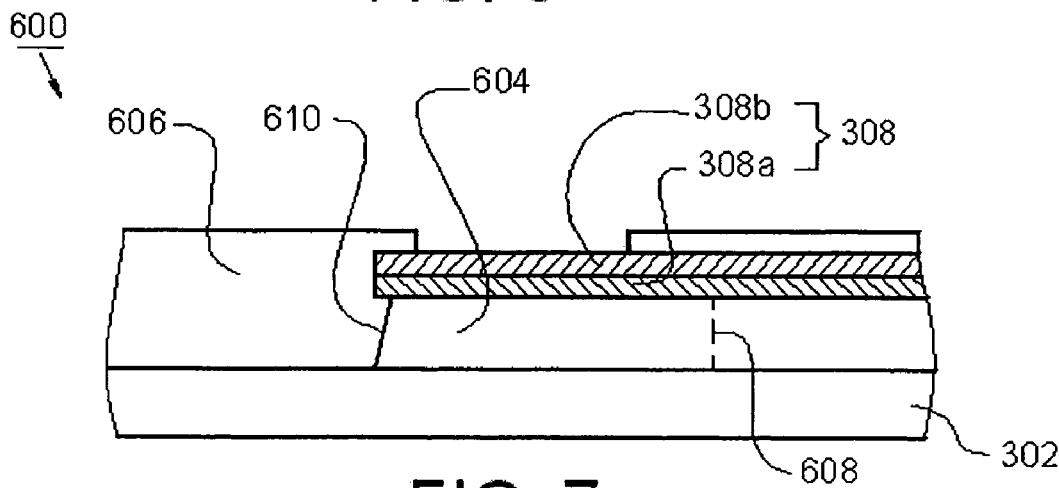
FIG. 7 is the cross section of the substrate of FIG. 6 along the 7-7 line.

To solve the above-mentioned problems, the present invention provides a substrate 600. Referring to FIGS. 6 and 7, which comprises a dielectric layer 302, a plurality of conductive circuits 602 and a plurality of bonding pads 604 formed on the dielectric layer 302, a metal thin deposition layer 308 formed on the conductive circuits 602 and the bonding pads 604, and a solder mask 606 formed on the dielectric layer 302 and the conductive circuits 602. The bonding pad 604 has opposing two ends 608 and 610, and the end 608 of the bonding pad extends from the conductive circuits 602. According to the present invention, during the formation of the solder mask 606, the end 610 of the bonding pad 604 is covered by the solder mask 606 to have the protruding portion of the end 610 of the metal thin deposition layer 308 on the bonding pad 604 embedded in the solder mask 606. Although the metal thin deposition layer 308 has a portion protruding over the conductive circuits 602 and the bonding pads 604 to have the protruding portion of the metal thin deposition layer not supported by the conductive circuits 602 or the bonding pads 604, the protruding portion of the end 610 of the metal thin deposition layer over the bonding pad 604 is embedded in the solder mask 606 so that the protruding portion can be supported and protected by the solder mask 606. Although the bonding pads 604 are pressed and stretched during wire bonding or testing, the metal thin deposition layer 308 does not easily collapse, peel and even break.

Although the present invention has been disclosed by the above-mentioned, preferable embodiments, they are not used to limit the present invention. Any one skilled in the art, within the spirits and scope of the present invention, can make any kind of change and modification. Thus, the protection scope of the present invention should be defined as the appended claims.

What is claimed is:

1. A substrate for packaging a semiconductor chip, comprising:
   a dielectric layer;
   a plurality of conductive circuits formed on the dielectric layer;
   a plurality of bonding pads formed on the dielectric layer, the bonding pad having opposing first and second ends, the first end of the bonding pad extending from the conductive circuits;
   at least one thin metal deposition layer formed on the bonding pads and connected with the conductive circuits, wherein the thin metal deposition layer has at least one portion to protrude from the conductive circuits and the bonding pads so that the protruding portion of the thin metal deposition layer is not supported by the conductive circuits and the bonding pads; and
   a solder mask formed on the dielectric layer and the conductive circuits, wherein the bonding pad is exposed from the solder mask except that the second end of each bonding pad is covered by the solder mask to have the protruding portion of the thin metal deposition layer embedded in the solder mask.

2. The substrate of claim 1, wherein the first end of the bonding pad extends from the conductive circuits.

3. The substrate of claim 1, wherein
   the protruding portion of the metal thin deposition layer is not directly supported from below by the conductive circuits and the bonding pads; and
   the protruding portion of the thin metal deposition layer is directly supported from below and covered from above by the solder mask in which the protruding portion of the thin metal deposition layer is embedded.

4. A substrate for packaging a semiconductor chip, comprising:
   a dielectric layer;
   a plurality of conductive circuits formed on the dielectric layer;
   a plurality of bonding pads formed on the dielectric layer, the bonding pad having opposing first and second ends, the first end of the bonding pad extending from the conductive circuits;
   at least one thin metal deposition layer formed on the bonding pads, wherein the thin metal deposition layer has at least one portion to protrude from the bonding pads so that the protruding portion of the thin metal deposition layer is not supported by the bonding pads; and
   a solder mask formed on the dielectric layer and the conductive circuits, wherein the bonding pad is exposed from the solder mask and the second end of each bonding pad is covered by the solder mask to have the protruding portion of the thin metal deposition layer embedded in the solder mask; and
   wherein the protruding portion of the thin metal deposition layer is directly supported from below and covered from above by the solder mask in which the protruding portion of the thin metal deposition layer is embedded.

5. The substrate of claim 4, wherein
   the protruding portion of the thin metal deposition layer is not directly supported from below by the conductive circuits and the bonding pads.

* * * * *